United States Patent [19]

Fujita et al.

[11] Patent Number: 5,424,578
[45] Date of Patent: Jun. 13, 1995

[54] LEAD FRAME FOR USE IN A SEMICONDUCTOR DEVICE AND A SEMICONDUCTOR DEVICE USING THE SAME

[75] Inventors: Kazuya Fujita, Nabari; Kenji Toyosawa, Ikoma, both of Japan

[73] Assignee: Sharp Kabushiki Kaisha, Osaka, Japan

[21] Appl. No.: 180,334

[22] Filed: Jan. 12, 1994

[30] Foreign Application Priority Data

Jan. 29, 1993 [JP] Japan ................... 5-013145

[51] Int. Cl.6 .............. H01L 23/48; H01L 29/44; H01L 29/52; H01L 29/60
[52] U.S. Cl. ........................ 257/677; 257/666
[58] Field of Search ............... 257/666, 677

[56] References Cited

U.S. PATENT DOCUMENTS

| 4,707,724 | 11/1987 | Suzuki et al. | 257/677 |
| 5,138,431 | 8/1992 | Huang et al. | 257/677 |

FOREIGN PATENT DOCUMENTS

| 59-36954 | 2/1984 | Japan | 257/677 |
| 61-42941 | 3/1986 | Japan | 257/677 |
| 1-106454 | 4/1989 | Japan | 257/677 |
| 1-223755 | 9/1989 | Japan | 257/677 |

OTHER PUBLICATIONS

Japanese Patent Application Laid-Open Sho 51 No. 115775 with published English abstract.
Japanese Patent Application Laid-Open Sho 60 No. 79760 with published English abstract.
Japanese Patent Application Laid-Open Hei 3 No. 191557 with published English abstract.

*Primary Examiner*—Sara W. Crane
*Assistant Examiner*—S. V. Clark
*Attorney, Agent, or Firm*—Nixon & Vanderhye

[57] ABSTRACT

A lead frame for use in a resin-sealed semiconductor device includes: a lead frame with inner lead portion or inner lead portion and die pad portion being silver-plated and outer lead portion being solder-plated; and a semiconductor chip being die-bonded on said die pad portion and wire-bonded to said inner lead portion. The lead frame is constructed such that a solder plating layer is provided on the top surface of the lead frame while a tin plating layer is provided under the solder plating layer. Alternatively, a copper or nickel layer or layers are provided under the solder layer or between the solder layers.

16 Claims, 13 Drawing Sheets

LEAD FRAME FOR USE IN A SEMICONDUCTOR DEVICE AND A SEMICONDUCTOR DEVICE USING THE SAME

BACKGROUND OF THE INVENTION

1. Field of the Invention

The present invention relates to a lead frame for use in a semiconductor device of resin-sealed type, and relates in particular to a pre-plated frame (which will hereinafter be abbreviated as a PPF) in which the outer lead portion is solder-plated in advance.

2. Description of the Prior Art

FIG. 1A shows a current predominant assembling process of a semiconductor device of resin-sealed type. In accordance with the process, a wafer is diced into chips. Then, the obtained chip is die-bonded with silver paste onto a lead frame in which a die pad portion and an inner lead portion are silver-plated. Subsequently, wire-bonding between the inner lead portion and the chip is conducted using gold wires. Thereafter, the thus formed structure is sealed with a molding resin. After the molding resin-sealing step, the outer lead portion is subjected to surface treatments such as solder plating, tin plating, solder dipping and the like. Then, the operation is followed successively by forming, marking electric examination and an appearance observation check.

Meanwhile, in order to reduce the processing time taken after the molding step, an assembling process has been proposed in which use is made of a preplated frame (PPF) or a lead frame having not only an inner lead portion and a die pad portion silver-plated but also having an outer lead portion previously plated with solder or the like in the lead frame step. Such a process is disclosed, for example in Japanese Patent Application Laid-Open Sho 51 No. 115775.

FIG. 1B is a flowchart showing the assembling process using a PPF.

In the assembling process using a PPF, it is not necessary to effect solder plating and the like for outer package plating after the molding step because the PPF is formed of a lead frame in which the inner lead portion is silver-plated and the outer lead portion is solder-plated in advance.

Nevertheless, since the PPF has been provided with solder plating, if the solder layer in the outer lead portion is melted down in the assembling process, the solderability will be degraded when the semiconductor device is mounted on a board while the solder layer of the outer lead portion changes in color to thereby give bad appearance to the semiconductor device. Accordingly, it is necessary to configure a low temperature assembling process (183° C. or less) in which the solder plating layer of the outer lead cannot melt and therefore cannot change in color through a series of steps.

Therefore, die bonding material and molding resin material which cure at a temperature lower than 183° C. must be developed for use in the die bonding and molding steps, respectively.

In spite of such disadvantages, the use of the PPF will omit the need for effecting outer lead plating after molding, so that the processing time can be reduced by two days. Additionally, the omission of the outer plating may lead to cost reduction. For these reasons, the assembling process using the PPF has drawn attention in recent years.

FIG. 2 is a plan view showing an example of such a PPF. In the figure, the PPF is composed of outer leads 70, a solder plating layer 71 on the outer leads, inner leads 80, silver plating layer 81 on the inner leads, a die pad 90 and a silver plating layer 91 on the die pad.

Plating of outer leads used in the assembly process using such a PPF is conducted mainly by solder plating.

FIG. 3 shows a structure of plating on the outer lead. In the figure, formed on a lead frame base 11 is a solder plating layer 20, which contains tin 21 and lead 22.

For plating outer leads, tin plating can be carried out in place of solder plating, but solder plating may provide improved solderability at the time the final semiconductor device is mounted to assure the superiority of the solder plating. There are two kinds of solder to be used for solder plating in which tin and lead are compounded in ratios of 6:4 and 9:1, and the latter is used more frequently.

Moreover, there are various kinds of solder, but the solder used for plating outer leads in semiconductor devices is composed of tin and lead with no other metal compounded.

Generally, the solder plating is performed immediately on the base of a lead frame, but in some cases strike-plating may be executed using such as copper, tin/nickel and the like in order to enhance adhesion between the solder plating and the substrate or undercoating to be solder-plated.

Since solder plating is of a wet process, the frame may be heated by blowing hot air (about 100° C. for ten seconds) so as to be dried after the rinsing step, but the lead frame undergoes no other heat treatment except for the drying purpose.

FIG. 4 is a sectional view showing a semiconductor device of resin-sealed type using a prior art PPF. In the figure, the structure includes a semiconductor chip 111, a die pad 90, inner lead portion 80, outer lead portion 70 and metal wires 110 for wire-bonding. In a typical prior art PPF plating structure in which 42-alloy is used as a material constituting the lead frame, a silver plating layer 81 in a wire bonding region and a solder plating layer 71 in an outer lead portion 70 do not overlap with one another while part of the solder plating layer 71 is embedded in a molding resin 116 in most cases as shown in FIG. 4. In general, the solder layer 71 may be plated directly on the 42-alloy constituting the lead frame. Alternatively, a Cu strike layer of about 0.1 to 0.3 μm thick can be deposited as a substrate or undercoat as disclosed in Japanese Patent Application Laid-Open Sho 60 No. 79760. The purpose of providing the strike layer is to eliminate adverse influence of the solder-substituted plating layer adhered onto the surface of the silver plating layer. More specifically, in the process for preparing PPF, first silver plating layers 81, 91 are formed while portions other than inner lead portion 80 and die pad portion 90 being masked. Then, solder plating layer 71 will be formed while other portions than the outer lead portion 70 being masked. In this step, solder adheres onto the surface of silver plating layer to form solder-substituted plating producing a bad effect. In order to prevent the bad effect, a copper layer of about 0.3 μm in thickness is coated entirely on the surface as a temporary deposition for peeling after the silver plating, thereafter solder plating will be made. In this case, as the copper plating is peeled off after completion of the solder plating, the substituted plating may be removed and no copper plating exists on the undercoating of the silver plating layer.

By the way, in use of the PPF described above, deformation of solder plating may occur between outer leads in some cases after molding.

This deformation of solder plating arises due to the deposited solder on the outer leads of the PPF. Accordingly, no deformation occurs in the aforementioned assembling process as shown in FIG. 1A in which no PPF is used.

The solder plating deformation will hereinafter be described with reference to FIGS. 5 through FIG. 8.

Initially, FIG. 5 is a plan view showing the PPF shown in FIGS. 2 and 3, clamped by mold press. In FIG. 5, lines 1 and 2 indicate clamping boundaries of a mold. Reference numeral 100 designates deformation of solder plating layer depressed between outer leads and mold-clamping portion is designated at 121.

FIG. 6 is a side-sectional view taken on a line 5-6 shown in FIG. 5, showing solder layer deformation 100 between outer leads.

Next, FIG. 7 is a side-sectional view taken on a line 3-4 shown in FIG. 5, showing a lead frame 11 clamped by a mold 120 with no molding resin filled. Here, in FIG. 7, a semiconductor chip is designated at 111 and gold wires for wire-bonding are designated at 110. A silver paste for die-bonding is denoted by 92.

FIG. 8 is a perspective view showing a semiconductor device after the forming step. Reference numeral 116 designates molding resin.

When a solder plating layer 20 on outer leads 70 is clamped as shown in FIG. 7 by a mold 120 in the molding step, portions of the solder layer under mold-clamping portion 121 are pressed and crushed to be depressed between outer leads forming burr-like deformation 100 (refer to FIGS. 5 and 6).

More specifically, in the molding step, the solder plated portion (dam bar portion and the like) is clamped with a pressure of 1 to 3 ton/cm$^2$. This force deforms the solder layer in clamping portion 121 and presses out the layer to form deformation 100 between the leads as shown in FIGS. 5 and 6. In this state, molding resin 116 is injected into the mold cavity. After the resin curing process, lead wires are cut to be bent. To achieve this, the resin portion filled inside the dam bar is cut out. Then, the dam bar is cut, the solder deformation 100 which has been crushed out, adheres to the side of the leads. The adhered portions will be left as flushes 101 at the lead bending step.

The deformation 100 of solder plating layer occurs frequently when Fe-alloy material such as 42-alloy (Fe: Ni=58:42) is used as a material for lead frame 11. This suggests that a solder deposited on a copper frame has a higher hardness in warm-temperature range than the same solder deposited on a Fe-alloy material.

Pronounced deformations of the solder layer may not be removed even when removal of resin burrs in tie rod portion is executed in the forming step. In such cases, flushes 101 of solder remain between outer leads 70, and this could cause short-circuits or leakage between terminals after the semiconductor device is mounted (refer to FIG. 8).

This problem is critical particularly when reliable quality is to be established in quad-flat package (QFP) type semiconductor devices having a large number of pins with a narrow outer lead pitch (0.65 mm or less).

The deformation of solder plating cannot be attributed to the solder layer being molten since the mold is used at lower temperatures than the melting point of the solder (183° C. or less) but the deformation can be attributed to the great clamping pressure acted on the mold and the reduced hardness of the solder plating layer in warm-temperature range.

The mold in the molding step is used at temperatures ranging from 160° to 180° C. In this temperature range, hardness of the solder plating layer is low as compared to that at normal temperature. According to the experiment performed by the inventors of the present application, it was found that the solder plating layer at normal temperature has a hardness of about 16 Hk (Knoop hardness, weight: 1 g) whereas the hardness of the same solder layer at 170° C. is reduced to about 5 Hk.

As the temperature of the mold during molding is lowered in order not to reduce the hardness of the solder plating layer, transfer mold becomes difficult to be performed. This means that it is impossible to decrease the temperature of the mold.

It was also confirmed by the present inventors hereof that when clamping pressure on the mold was lowered, the deformed state of the solder layer was decreased.

Actually, when clamping pressure on mold was lowered from about 2t/cm$^2$ to about 1t/cm$^2$, the degree of the deformation of the solder layer was improved but this measure could not lower the frequency of the deformation of solder layer.

On the other hand, when the clamping pressure on mold was reduced, resin leak occurred from the clearance between the mold and the lead frame resulting in failure to achieve resin-molding. Accordingly, it is impossible to prevent deformation of the solder layer by lowering the clamping force on mold.

It was also found that deformation of a solder layer could not occur when the solder layer was 4 μm or less in thickness, and that the thicker the solder layer, the greater the solder layer was deformed.

With a layer thickness of about 7 μm the solder layer was displaced to gaps between the outer leads in excess of 0.4 mm.

When a QFP having an outer lead pitch of 0.8 mm was used, the deformed solder filled up gaps between the outer leads.

When the solder layer of 7 μm thick was clamped, the thickness of the layer reduced to about 4 μm and the solder corresponding to the loss of thickness was crushed out between outer leads.

Accordingly, if the thickness of the solder plating layer was controlled to be 4 μm or less, the problem would be eliminated. Since the controlling tolerance of the thickness of the solder layer upon production of PPF is ±1 μm, the average thickness of the solder layer must be 3 μm in order to regulate the thickness of the solder layer within 4 μm or less.

Specifically, for making the solder layer of 4 μm thick or less, the thickness of the solder layer will disperse between 2 μm and 4 μm.

However, with a solder layer thickness of 3 μm or less, the solderability in mounting the semiconductor device onto the substrate will be degraded. This indicates that reduction of the thickness of solder plating is not feasible.

Accordingly, it was difficult to prevent the solder layer deformation by regulating the solder layer thickness.

As described heretofore, in order to prevent the solder layer deformation, reduction of the clamping pressure on the mold as well as reduction of the thickness of the solder plating layer was tried and investigated only to exhibit insufficiency.

In order to eliminate the solder layer deformation, Japanese Patent Application Laid-Open Hei 3 No. 191557 discloses a method in which no solder plating is provided in clamping portion 11.

However, since the positioning deviation of solder plating at present is ±0.4 mm, if the solder plating would be omitted in the clamping portion of the mold, semiconductor devices having short outer leads may fail to be solder-plated in their outer lead portion. Therefore, it was found that this method could not be applied to all kinds of semiconductor devices.

Besides, in this method, the lead portion with no solder layer formed is likely to be exposed outside the resin sealing, resulting in reduction of corrosion resistance as well as forming resin burrs at that portion.

SUMMARY OF THE INVENTION

It is therefore an object of the present invention to provide a lead frame wherein it is possible to prevent deformation of solder plating caused when a mold is clamped at molding and generation of solder burrs and flushes arising with the deformation upon lead frame cutting and bending. The object of the present invention also includes provision of semiconductor devices using the lead frame.

In order to achieve the above objects, a first feature of the present invention resides in that a lead frame for use in a resin-sealed semiconductor device comprises: a lead frame with inner lead portion or inner lead portion and die pad portion being silver-plated and an outer lead portion being solder-plated; and a semiconductor chip being die-bonded on the die pad portion and wire-bonded to the inner lead portion, and the lead frame is constructed such that a tin plating layer is provided under the solder plating layer in the outer lead portion.

A second aspect of the present invention resides in that a lead frame for use in a resin-sealed semiconductor device comprises: a lead frame with inner lead portion or inner lead portion and die pad portion being silver-plated and outer lead portion being solder-plated; and a semiconductor chip being die-bonded on the die pad portion and wire-bonded to the inner lead portion, and the lead frame is constructed such that a solder plating layer is formed on the surface of the outer lead portion by plating solder in a solder plating bath containing any element of copper and nickel which enhances the hardness of solder plating in warm-temperature range.

A third aspect of the present invention lies in that a lead frame for use in a resin-sealed semiconductor device comprises: a lead frame with inner lead portion or inner lead portion and die pad portion being silver-plated and outer lead portion being solder-plated; and a semiconductor chip being die-bonded on the die pad portion and wire-bonded to the inner lead portion, and the lead frame is constructed such that a metal layer of copper or nickel which easily diffuses into solder plating and which enhances the hardness of solder plating in warm-temperature range is provided under the solder plating layer in the outer lead portion.

In the third configuration, a fourth feature of the present invention are that the metal layer provided under the solder plating layer comprises a copper layer, and a fifth feature of the present invention in the same configuration is that the copper layer is 1 to 5 μm in film thickness.

A sixth feature of the present invention resides in that a lead frame for use in a resin-sealed semiconductor device comprises: a lead frame with inner lead portion or inner lead portion and die pad portion being silver-plated and an outer lead portion being solder-plated; and a semiconductor chip being die-bonded on the die pad portion and wire-bonded to the inner lead portion, and the lead frame is constructed such that a copper plating layer is provided under the silver plating layer provided in the inner lead portion and the die pad portion as well as under the solder plating layer provided in the outer lead portion.

A seventh feature of the present invention resides in that a lead frame for use in a resin-sealed semiconductor device comprises: a lead frame with inner lead portion or inner lead portion and die pad portion being silver-plated and outer lead portion being solder-plated; and a semiconductor chip being die-bonded on the die pad portion and wire-bonded to the inner lead portion, and the lead frame is constructed such that one or two metal layers of copper or nickel which easily diffuses into solder plating and which enhances the hardness of solder plating in warm-temperature range are provided inside the solder plating layer in the outer lead portion.

Additionally, eighth through fourteenth features of the present invention reside in semiconductor devices using the semiconductor device lead frames having the first to seventh aspect of the present invention, respectively.

The aspects and features of the present invention is such as described above. In accordance with the first and eighth features of the present invention, since a tin plating layer having a high hardness is provided under the solder plating layer, the outer lead plating as a whole is improved in hardness. Accordingly, deformation of the solder plating layer at molding can be eliminated, therefore, no burr of solder plating will occur which would arise due to deformation of solder plating after the forming step, thus allowing provision of a highly reliable package using a PPF.

According to the second and ninth features of the present invention, since an element selected any one of copper and nickel mixed in the solder plating bath for improving the hardness of the solder plating in warm-temperature range will be contained in the formed solder plating layer, the hardness and melting point for the solder layer are heightened to thereby enhance deformation resistance. Accordingly, the deformation of solder plating occurring at mold-clamping is inhibited and no burr of solder plating will occur which would arise due to deformation of solder plating layer after the forming step, thus allowing provision of a highly reliable package using a PPF.

According to the third to sixth and tenth to thirteenth of the present invention, since an element selected from any one of copper and nickel for improving the hardness of the solder plating in warm-temperature range will be contained in the solder plating layer by virtue of diffusion of a metal layer made of the above-mentioned element disposed under the solder plating layer, the hardness and melting point for the solder layer are heightened to thereby enhance deformation resistance. Accordingly, the deformation of solder plating occurring at mold-clamping is inhibited and adhesion between the lead frame base and the solder layer is improved, so that solder burr occurring at lead-cutting and lead-bending process can be prevented, thus allowing provision of a highly reliable package using a PPF.

According to the seventh and fourteen the features of the present invention, since an element selected from any one of copper and nickel for improving the hardness of the solder layer in warm-temperature range will be contained in the solder plating layer by virtue of diffusion of a metal layer made of the aforementioned element inserted between the solder plating layers, the hardness and melting point for the solder layer are heightened to thereby enhance deformation resistance. Accordingly, the deformation of solder layer occurring at mold-clamping is inhibited and no burr of solder plating will occur which would arise due to deformation of solder plating after the forming step, thus allowing provision of a highly reliable package using a PPF.

In any of the above inventions, if solder plating is provided on the mold-clamping portion, deformation of solder plating can be prevented as described above, so that it is possible to apply the above inventions to any type of semiconductor devices.

DESCRIPTION OF THE PREFERRED EMBODIMENTS

Embodiments of the present invention will be described hereinafter with reference to the accompanying drawings.

Figure 9:
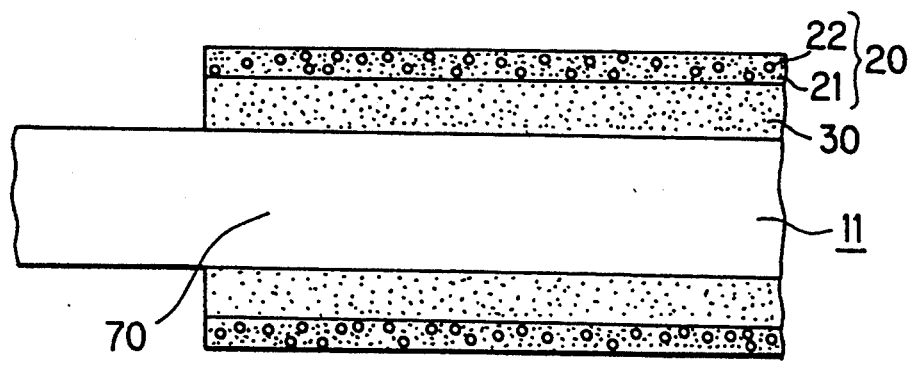
FIG. 9 is a sectional view showing a structure of solder plating layers on an outer lead in a PPF in accordance with a first embodiment of the present invention.

Initially, FIG. 9 is a sectional view showing a structure of solder plating layers on an outer lead in accordance with a first embodiment of the present invention. Provided on a lead frame base 11 is a tin plating layer 30, on which a solder plating layer 20 is provided. The topmost surface of the outer lead is formed by the solder layer. Solder plating layer 20 contains tin 21 and lead 22.

In the prior art where a single solder plating layer is provided on the outer lead, the thickness of the solder plating layer is required to be equal to or more than 3 $\mu$m in view of solderability. In contrast, the plated outer lead structure according to the present invention, with a total thickness of the topmost solder plating layer (having a thickness of 0.5 $\mu$m or more) and the tin plated undercoating being equal to or more than 3 $\mu$m, can assure sufficient solderability, and still no deformation of the solder layer occurs.

Additionally, in the present invention, solder plating layer 20 having a lower hardness is made thin whereas the tin plating layer 30 having a higher hardness is made thick.

As solderability largely depends on the solder plating layer on the top surface of the outer lead, the solder plating layer is in general composed of a 9:1 solder. However, a 6:4 solder was confirmed to improve the solderability still more if it was used for plating the topmost surface of the outer leads in the present invention.

Figure 10:
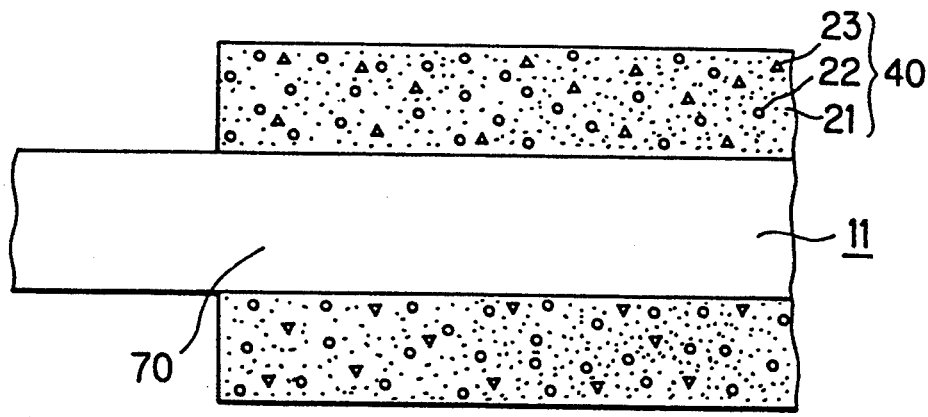
FIG. 10 is a sectional view showing a structure of solder plating layers on an outer lead in a PPF in accordance with a second embodiment of the present invention.

Next, FIG. 10 is a sectional view showing a structure of an outer lead having solder plating layers thereon in accordance with a second embodiment of the present invention. The solder plating layer in this embodiment contains elements such as copper 23 for enhancing the hardness of the solder layer. In FIG. 10, designated at 40 is a solder plating layer with copper particles mixed, and reference numerals 21 and 22 indicate tin and lead, respectively, like the case shown in FIG. 9. As a mixed metal, nickel was found to work well other than copper. In this case, the content of copper in the solder deposition is limited to at most 1% or less (measured by EPMA: Electron Probe Micro-Analyzer). This is because copper content in excess of 1% will lower the solderability of the solder-layer. Provision of copper element into the layer can be carried out by adding copper ions in a solder plating bath to prepare a three component solder plating bath (i.e., including copper, tin and lead), and using thus prepared solder plating bath upon production of PPF. In this case, tin and lead have standard oxidation reduction potentials of $-0.14$ V and $-0.13$ V, respectively, whereas copper has a standard oxidation reduction potential of $+0.34$ V. Therefore, if copper ions are added simply in the two component solder plating bath, copper will be grown in the resultant three component solder plating bath, at extremely high plating speed. For this reason, the copper should be added in a form of copper complex in order to shift the standard oxidation reduction potential of copper in the negative direction. Further, it is necessary to control the copper concentration in the solder plating bath so that the copper content may not exceed 1.0%.

The solder plating layer obtained in the above method will have a hardness of about 20 Hk in warm-temperature range, causing no solder plating layer deformation.

Figure 11A:
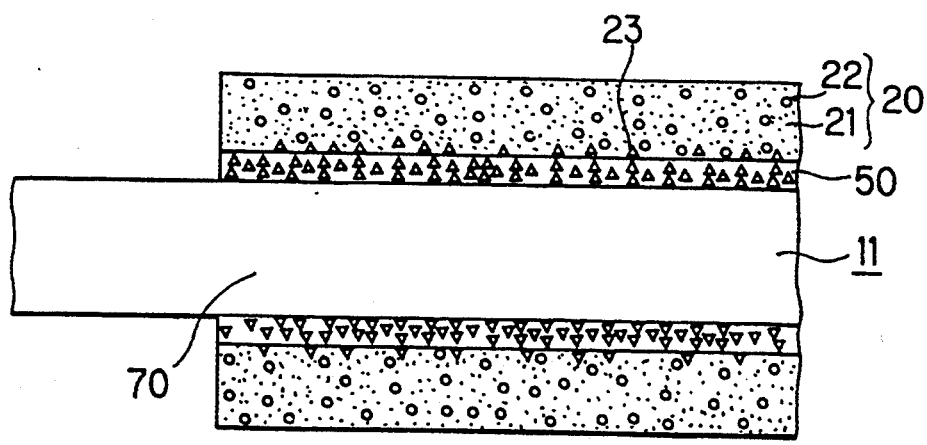
FIG. 11A is a sectional view showing a structure of solder plating layers on an outer lead in a PPF in accordance with a third embodiment of the present invention.
Figure 11B:
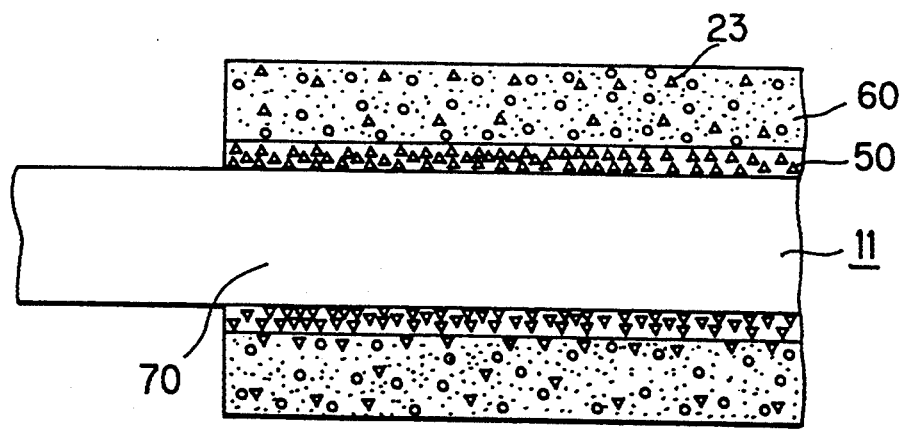
FIG. 11B is a sectional view showing a situation where metal particles in a metal layer are diffused into the solder plating layer shown in FIG. 11A.

Next, FIGS. 11A and 11B show a structure of solder plating layers on an outer lead in accordance with a third embodiment of the present invention. In this embodiment, there is provided a metal layer 50 of a metal such as copper, etc., that is likely to be diffused into solder layer 20 as an undercoating for solder plating layer 20. In the figures, reference numeral 23 designates a metal such as copper and the like. Particles of copper 23 in metal layer 50 will diffuse into the solder plating layer. Here, FIG. 11A shows the solder plating layer immediately after plating in which, therefore, particles of copper 23 only exist within 1 μm in depth from the interface between the solder plating layer and the metal layer and have not yet diffused sufficiently into solder plating layer 20. On the other hand, FIG. 11B shows a state in which particles of copper 23 have diffused sufficiently to form a solder plating layer 60 with copper particles 23 uniformly dispersed.

Sufficient diffusion of copper particles can be achieved by making the metal layer thicker enough than the solder plating layer. Diffusion of copper particles can also be realized more effectively by heating the structure not more than the melting point of the solder. In this case, it is possible to reduce the metal layer in thickness as compared to the former case.

As an example, with a solder plating layer thickness of 5 μm and a metal layer thickness of 0.2 to 0.5 μm, when the structure is heated at 175° C. for one hour, copper particles will be dispersed into the solder layer in a ratio of about 0.1 to 0.3%. The more metal such as copper is diffused into the solder layer, the higher the hardness of the layer is.

One hour heat treatment at 175° C. may impart a warm-temperature hardness of about 20 Hk to the solder layer. Since a solder plating layer with no copper diffused presents a warm-temperature hardness of about 5 Hk, the copper dispersed layer can be considered to be markedly improved in hardness.

A further heat treatment will promote diffusion of copper particles to increase the hardness of the solder layer, but an excessive diffusion of copper in the solder plating layer will degrade solderability. Actually, with a 24-hour heat treatment at 175° C. the solder layer was found to change in color and degrade in solderability.

When a 6 μm-thick solder plating layer is provided with a copper layer of 1 μm or more in thickness, sufficient dispersion of copper can be expected without subjecting the structure to any heat treatment. In this connection, it should be noted that the thickness of copper plating is properly limited to at most 5 μm or less in a practical view point.

With regards to the silver layer formed on the inner lead portion and the die pad, it is also possible to assure adhesion between the silver layer and the lead frame base by providing a copper layer therebetween as an undercoat.

Nickel plating other than the copper plating can similarly improve the hardness in warm temperatures, but nickel has poor adhesion to solder. Hence, when nickel is used, portions of leads to be deformed when the leads are cut off and when the leads are bent could be easy to peel off and therefore produce solder flushes. For this reason copper plating is preferable to nickel plating.

Figure 12:
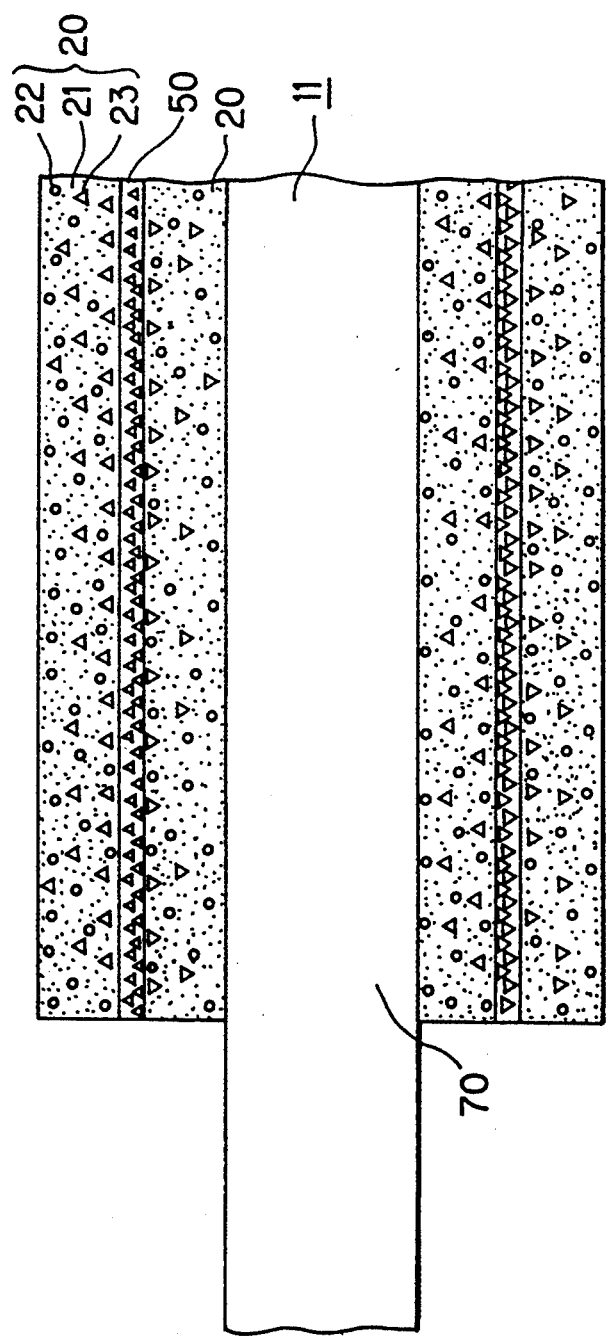
FIG. 12 is a sectional view showing a structure of solder plating layers on an outer lead in a PPF in accordance with a fourth embodiment of the present invention.

Next, FIG. 12 shows a structure of solder plating layers on an outer lead in accordance with a fourth embodiment of the present invention. In this embodiment, a first solder plating layer 20 is provided on a lead frame base 11. Next, a metal layer 50 of copper, etc., which diffuses easily in solder is provided on the solder layer. Finally, a second solder plating layer 20 is formed on the top of the above structure.

In this embodiment, by providing between two solder layers a metal layer of copper which is easy to diffuse in solder layer, it is possible to enhance the hardness of the solder layer in warm-temperatures without subjecting the structure to any heat treatment.

In general, the effect of preventing deformation of solder plating appearing differs depending upon the thickness of a solder plating. Here, provision of only a metal layer of copper having a thickness of about 0.2 to 0.5 μm between solder layers allows the copper metal to diffuse into the solder layers in the vicinity (about 1 μm in depth) of the interfaces on which the metal layer is in contact with the solder layers. As a result it is possible to enhance the hardness in warm-temperature ranges.

Nevertheless, with a solder plating having a large thickness, the effect of the copper plating of 0.2 to 0.5 μm thick is weakened. To deal with this, in the present invention, it is necessary to increase the thickness of copper plating or increase the number of copper plating layers.

A solder plating structure provided with a single layer copper plating of 0.2 to 0.5 μm thick in the solder plating is effective to prevent deformation of a solder plating layer of about 5 μm thick.

If the solder plating has a thickness of about 6 μm or more, it is necessary to provide a copper plating of about 1.5 μm or form two copper layers of 0.2 to 0.5 μm thick inside the solder plating layer.

In the present invention, when the solder plating has a greater thickness, the number of copper layers or the thickness of a copper layer formed in the solder layer is increased to more effectively prevent the solder layer deformation. Nevertheless, it is sufficiently effective to heat the structure in order to enhance the hardness of the solder plating in warm-temperature range.

Next specific examples of the present invention will be described with reference to the drawings.

In the description hereinafter, the semiconductor devices used in the following description of specific examples have a lead frame of QFP (quad-flat package) type with 44 pins. The lead frame is made of 42-alloy and is 0.15 mm thick with an outer lead pitch of 0.8 mm. In addition, as shown in Table 1 below, semiconductor devices having a lead frame of SOP type with 32 pins with an outer lead pitch of 1.27 mm were also used as in a part of the specific examples.

First, the first embodiment of the present invention will be described with reference to FIG. 9 mentioned above.

Figure 1B:
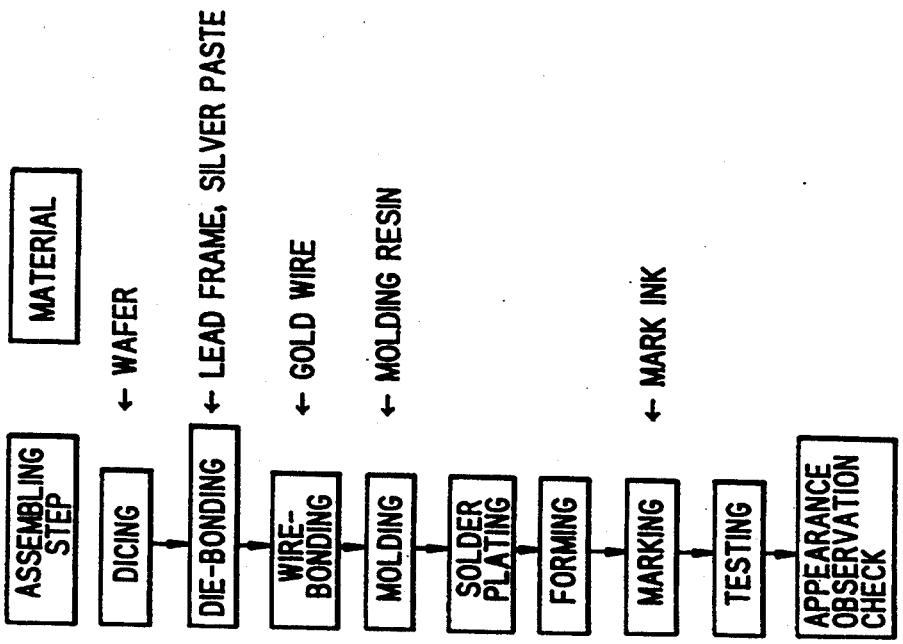
FIG. 1B is a flowchart showing a process of assembling a current resin-sealed semiconductor device using a PPF.
Figure 1A:
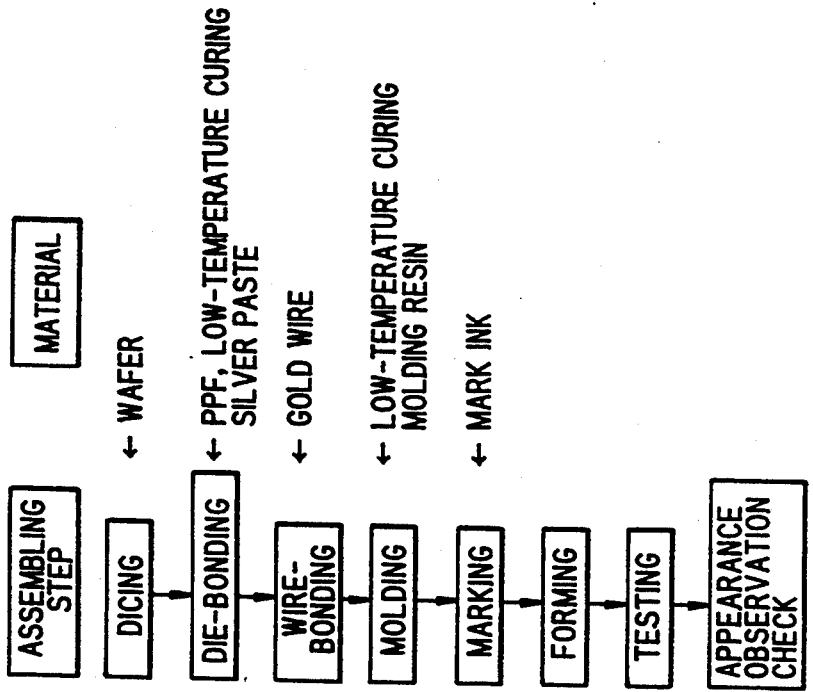
FIG. 1A is a flowchart showing a process of assembling a current predominant resin-sealed semiconductor device.
Figure 2:
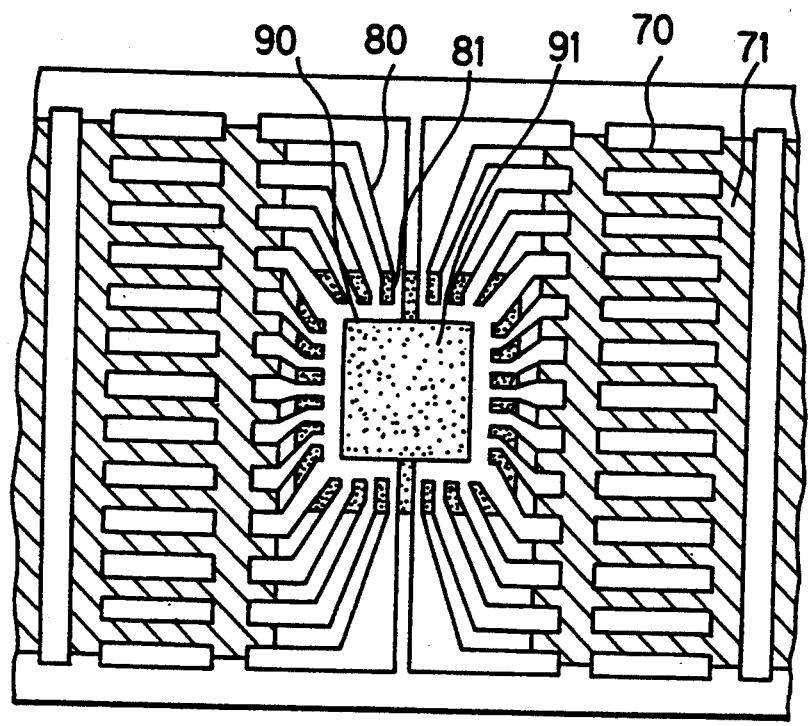
FIG. 2 is a plan view showing an example of a current PPF.
Figure 3:
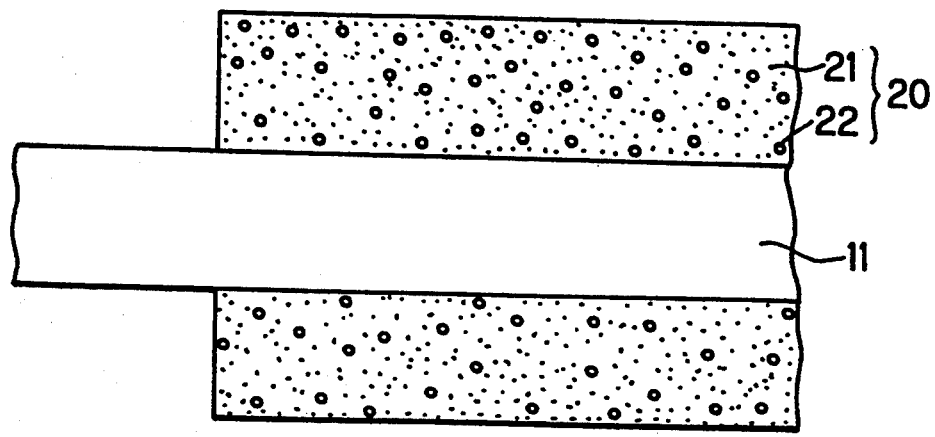
FIG. 3 is a sectional view showing a plating layer structure of an outer lead portion in a current lead frame.
Figure 4:
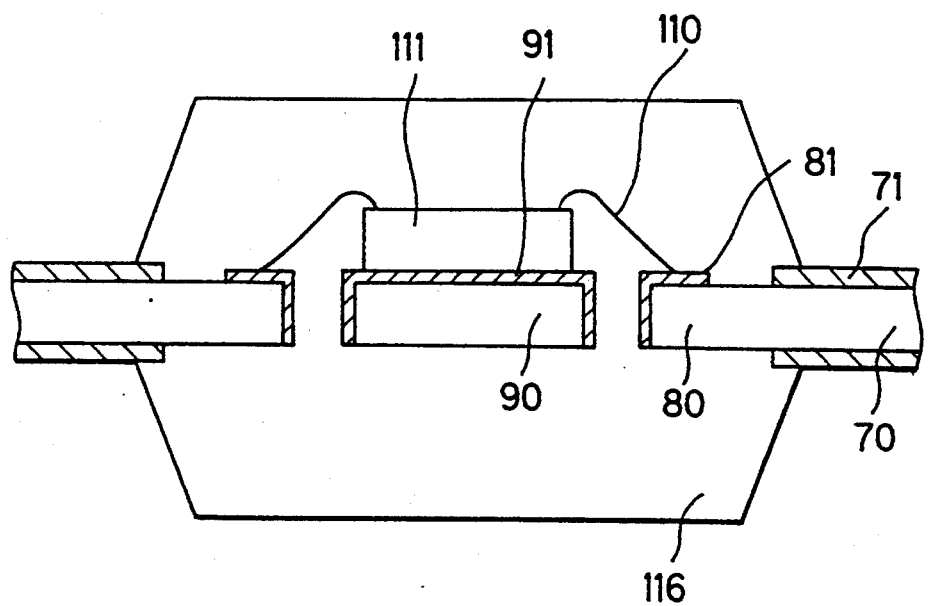
FIG. 4 is a sectional view showing a resin-sealed semiconductor device using a current PPF.
Figure 5:
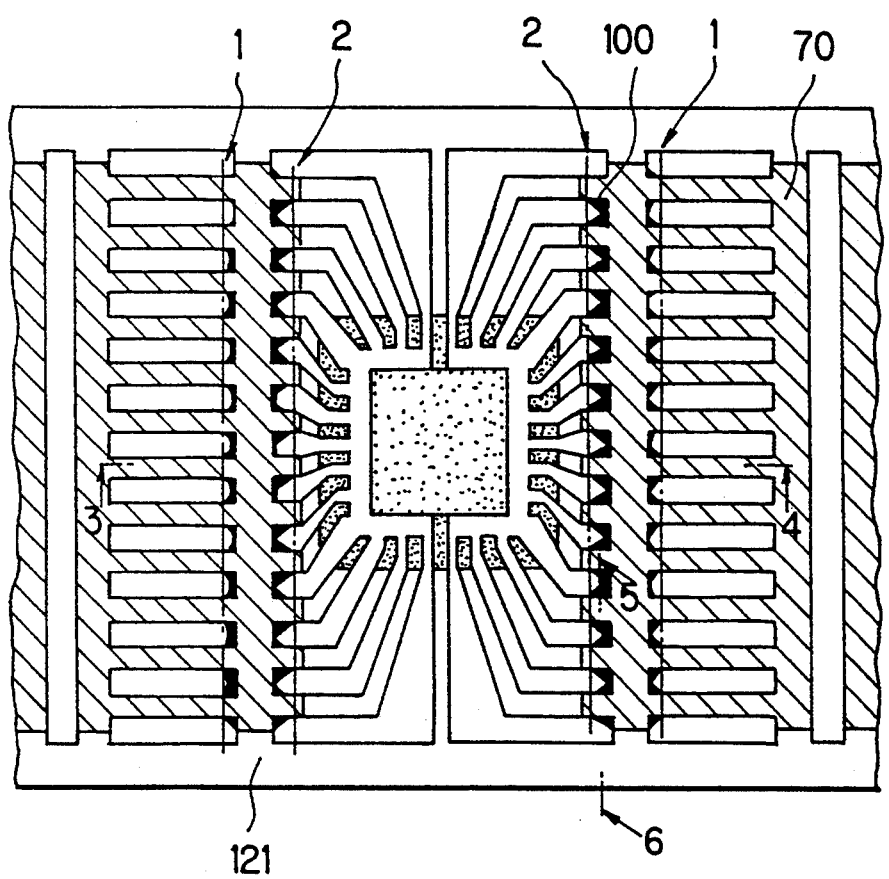
FIG. 5 is a plan view showing the PPF shown in FIGS. 2 and 3, clamped by a mold press.
Figure 6:
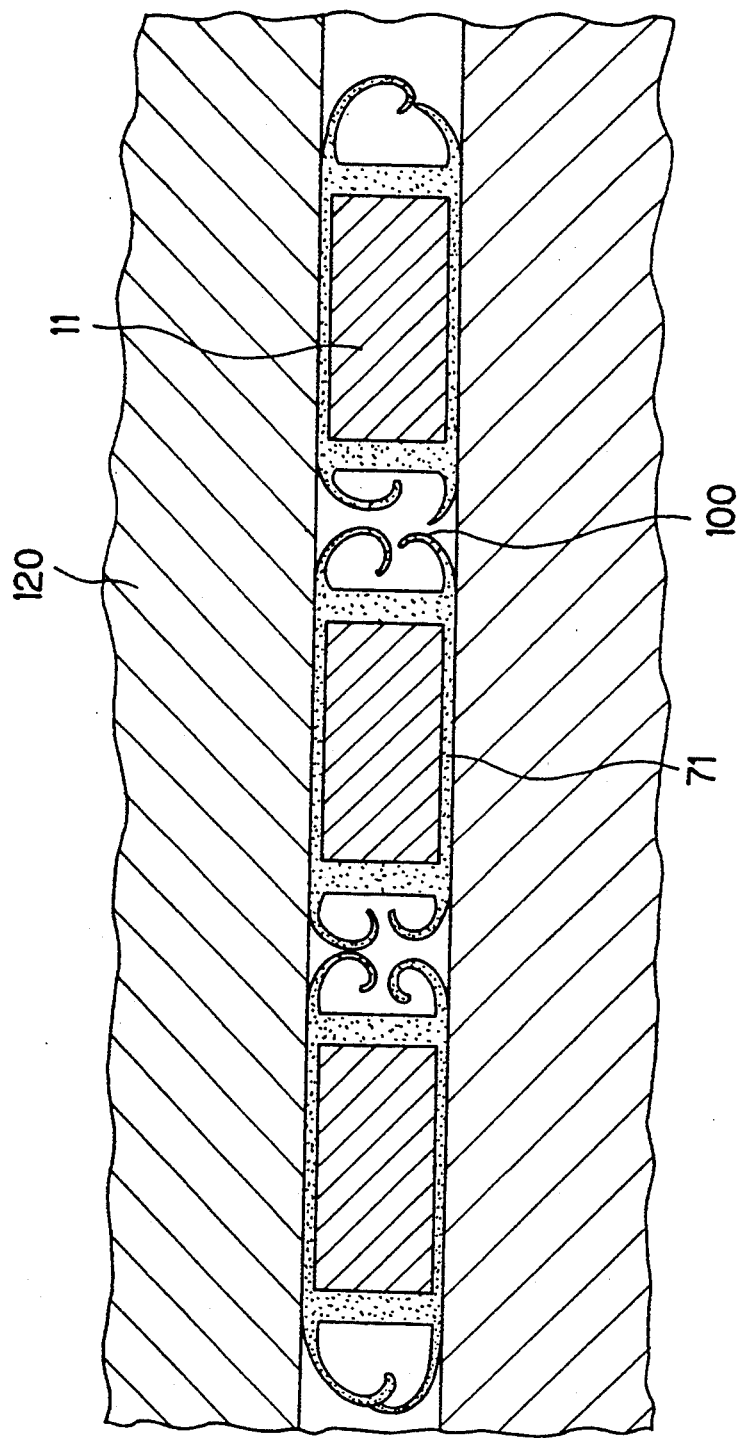
FIG. 6 is a side-sectional view taken on a line 5–6 shown in FIG. 5.
Figure 7:
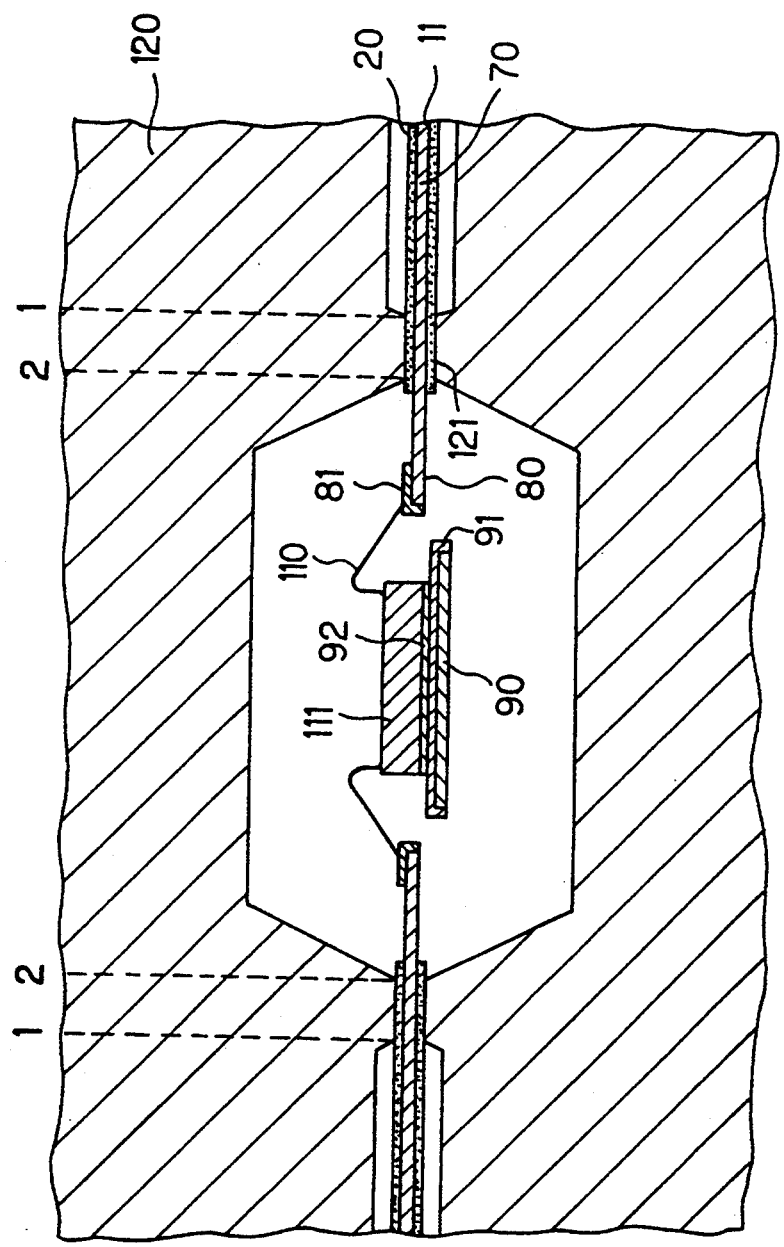
FIG. 7 is a side-sectional view taken on a line 3–4 shown in FIG. 5.
Figure 8:
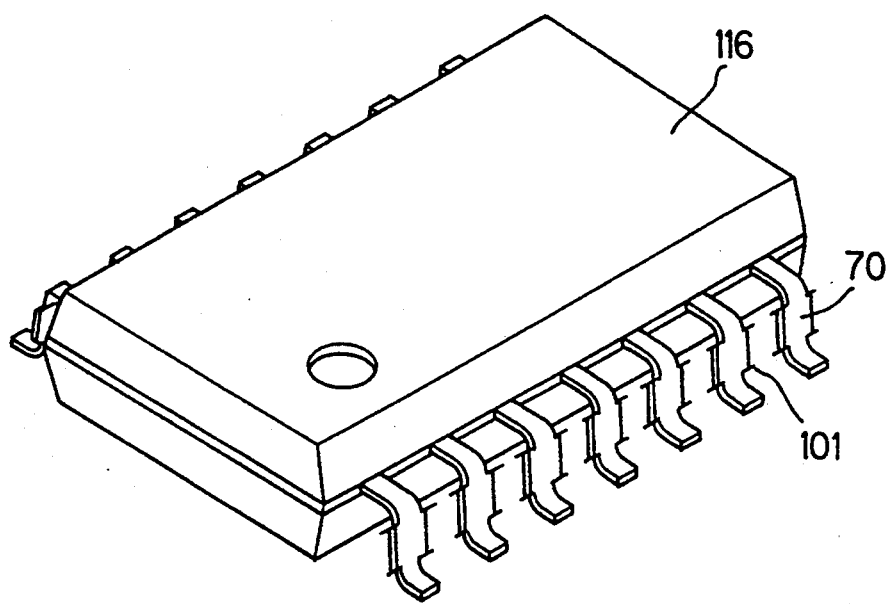
FIG. 8 is a perspective view showing a semiconductor device after forming process.

The PPF production process used was similar to that shown in FIG. 7. In the process, a silver plating was conducted with other than an inner lead portion 80 and a die pad portion 90 in a lead frame 11 being masked, so that inner lead portion 80 and die pad portion 90 were formed with silver plating layers 81 and 91, respectively. Next, in FIG. 9, other than outer lead portion 70 was masked to form a tin plating layer 30. Subsequently, a solder plating layer 20 was further formed on tin plating layer 30. As a result, a structure as shown in FIG. 9 was obtained in which tin plating layer 30 was formed on outer lead portion 70 and under solder plating layer 20.

The structure of the solder coated portion on outer lead 70 was formed of lead frame 11, tin plating layer 30 of 4 μm thick on the lead frame and 6:4 solder plating layer 20 of 1 μm thick on tin plating layer 30, and therefore was 5 μm in total thickness.

In use of the PPF thus formed a semiconductor chip 111 was die-bonded on the PPF with an epoxy silver paste 92 which cures at a temperature from 160° to 170° C. as shown in FIG. 7 above-mentioned. In addition, gold wires 110 were wire-bonded while super sonic waves being impressed at 160° to 170° C. Then, a mold 120 was clamped on the PPF having semiconductor chip 111 built therein by clamping pressure of 2 ton/cm$^2$ at a mold temperature of 160° C. and was poured with a resin at an injecting pressure of 100 kg/cm$^2$. The thus formed molding was extracted from mold 120.

As a result, it was confirmed that neither deformation of the solder plating nor degradation of solderability would occur after molding.

Next, the second embodiment of the present invention will be described with reference to FIG. 10 above.

Production process of PPF was similar to that shown in FIG. 7 mentioned above. Specifically, a silver plating was conducted with other than an inner lead portion 80 and a die pad portion 90 in a lead frame 11 being masked, so that inner lead portion 80 and die pad portion 90 were formed with silver plating layers 81 and 91 respectively. Next, in FIG. 10, other than outer lead portion 70 was masked to form a solder plating layer 40. A solder plating bath used contained copper content 23 in an adjusted amount of about 0.01 to 0.05%, in addition to tin 21 and lead 22. The solder plating in the solder plating bath was effected at normal temperature with a current density of 2A/dm$^2$ for 2 minutes. The solder plating thus produce is about 5 μm thick with a copper content of about 0.5%.

In use of the PPF thus formed a semiconductor chip 111 was die-bonded on the PPF with an epoxy silver paste 92 which cures at a temperature from 160° to 170° C. as shown in FIG. 7 above-mentioned. In addition, gold wires 110 are wire-bonded while super sonic waves being impressed at 160° to 170° C. Then, a mold 120 was clamped on the PPF having semiconductor chip 111 built therein by clamping pressure of 2 ton/cm$^2$ at a mold temperature of 160° C. and was poured with a resin at an injecting pressure of 100 kg/cm$^2$. The thus formed molding was extracted from mold 120.

In this case, the solder plating with copper content had a hardness at 170° C. of 25 Hk, and neither deformation of the solder plating nor degradation of solderability after molding was assuredly observed.

Next, specific examples with regards to the embodiment shown in FIGS. 11A and 11B of the present invention will be described.

Figure 13:
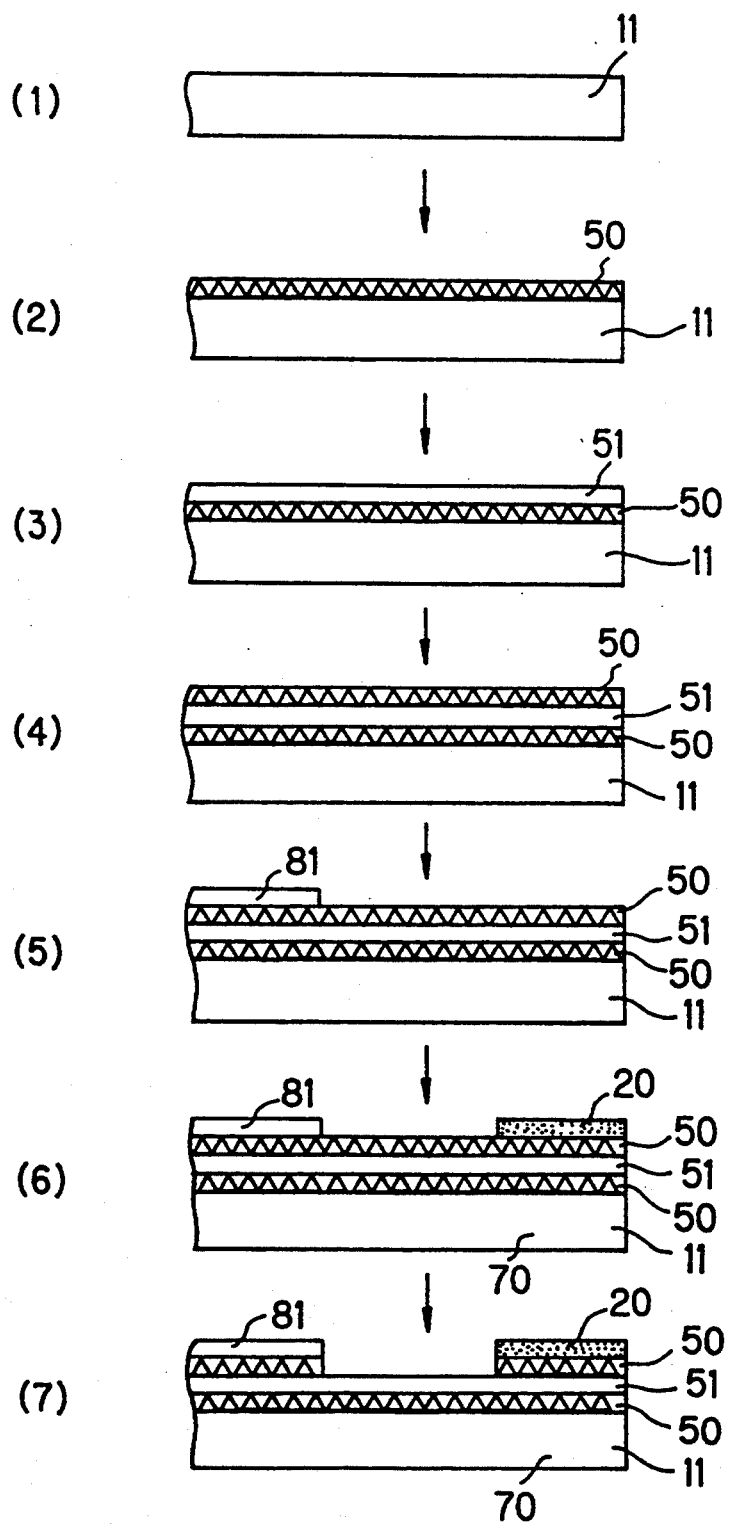
FIG. 13 is an illustrative view showing an example of processing steps for producing a PPF.

First of all, production process of PPF will be described with reference to production steps shown in FIG. 13.

Initially, in steps 1 through 2, a copper plating layer 50 is formed on a lead frame base 11. At step 3, a nickel plating is effected on the copper layer to form a nickel plating layer 51. At step 4, a copper plating is conducted again to form another copper plating layer 50 on nickel plating layer 51. Subsequently, at step 5, a partial silver plating is effected to form a silver plating layer 81 only on the inner lead portion. At step 6, a solder plating is effected only on outer lead portion 70 to form a solder plating layer 20. Finally, at step 7 the upper copper plating layer 50 is etched while silver plating layer 81 and solder plating layer 20 being masked.

In this case, the copper plating layer 50 under solder plating layer 20 is 0.2 to 0.5 μm thick while solder plating layer 20 has a thickness of about 5.0 μm.

Next, the thus obtained lead frame is heated in order to promote diffusion of copper particles. The heating was conducted at 175° C. for one hour in an oven in order not to melt down the solder plating layer.

In use of the PPF thus formed a semiconductor chip 111 was die-bonded on the PPF with an epoxy silver paste 92 which cures at a temperature from 160° to 170° C. as shown in FIG. 7 above-mentioned. In addition, gold wires 110 were wire-bonded while super sonic waves being impressed at 160° to 170° C. Then, a mold 120 was clamped on the PPF having semiconductor chip 111 built therein by clamping pressure of 2 ton/cm$^2$ at a mold temperature of 160° C. and was poured with a resin at an injecting pressure of 100 kg/cm$^2$. The thus formed molding was extracted from mold 120.

As a result, it was confirmed that neither deformation of the solder plating nor degradation of solderability would occur after molding.

In addition, in this case, with a thicker copper plating, e.g. 2 μm, the diffusion of copper particles into the solder plating layer can be accelerated resulting in reduction of heating time.

The resultant solder plating had a hardness at 170° C. of about 20 Hk. A longer heating will further heighten the hardness in the warm-temperature range.

Other than copper plating, effect of nickel plating was confirmed. Nevertheless, nickel had a poorer adhesion to solder, therefore the solder layer was easy to peel off partially at deformed portion as leads were cut off or bent resulting in generation of solder flushes.

Next, another specific example will be described in which a copper plating layer 50 having a thickness of 1 μm or more is conducted as an undercoating of solder plating layer 20 of outer lead portion 70 in lead frame 11, but no heat treatment will be effected differing from the above example.

In this example, a copper plating layer 50 having a thickness of 1 μm or more was conducted as an undercoating of solder plating layer 20.

Coating thickness of copper plating has an influence on copper diffusion amount into solder plating layer. For example, a solder plating layer having a thickness of 6 μm requires a copper layer of 1 μm or more in thickness in order to obtain sufficient deformation resistance without heating treatment. In contrast, if the solder plating layer is less than 6 μm in thickness, a copper layer having at least 1 μm can achieve a predetermined object (refer to Table 1). Nickel undercoating in place of copper is also able to inhibit the solder deformation upon mold clamping, but the nickel has a poor adhesion to solder, therefore the solder layer is easy to peel off partially at deformed portion as leads are cut off or bent resulting in generation of solder flushes.

TABLE 1

| Package (pin pitch) | Solder plating thickness (μm) | Undercoating thickness (μm) Cu | Undercoating thickness (μm) Ni | Undercoating thickness (μm) Cu | Reduction ratio (%) of solder plating layer after mold clamping | Solder flush generated ratio (%) |
| --- | --- | --- | --- | --- | --- | --- |
| QPF44 (0.8 mm) | 6 | — | — | — | 22 | 40 |
|  | 6 | 0.1 | — | — | 18 | 19 |
|  | 6 | 0.3 | — | — | 15 | 16 |
|  | 6 | 0.5 | — | — | 14 | 8 |
|  | 6 | 1.0 | — | — | 6 | 0 |
|  | 5 | 1.0 | — | — | ≦1 | 0 |
|  | 5 | 2.0 | — | — | ≦1 | 0 |
|  | 5 | 3.0 | — | — | ≦1 | 0 |
|  | 5 | 4.0 | — | — | ≦1 | 0 |
|  | 4 | 0.3 | 0.3 | 0.1 | 5 | 0 |
|  | 5 | 0.3 | 0.3 | 0.1 | 10 | 4 |
|  | 6 | 0.3 | 0.3 | 0.1 | 15 | 10 |
| SOP32 (1.27 mm) | 6 | — | — | — | — | 25 |
|  | 4 | 0.5 | — | — | — | ≦1 |
|  | 5 | 0.5 | — | — | — | 1 |
|  | 6 | 0.5 | — | — | — | 3 |
|  | 4 | 1.0 | — | — | — | 0 |
|  | 5 | 1.0 | — | — | — | 0 |
|  | 6 | 1.0 | — | — | — | 0 |
|  | 7 | 1.0 | — | — | — | ≦1 |

Mold clamping pressure: 2 ton/cm²

Now, PPF production process will be described in detail with reference to FIG. 14.

First, inner lead portion 80 and die pad portion 90 patterned at step 1 on a surface of a 42-alloy frame at first is degreased or cleaned at step 2. Copper plating layer 50 of 1 μm or more in thickness is formed on the entire surface as shown in step 3. Then, at step 4, silver plating are conducted while inner lead portion 80 and die pad portion 90 being masked so as to form silver layers 81 and 91 of 5 μm thick. Thereafter, as shown in step 5, with masking other than outer lead portion 70, a solder plating layer 20 of Sn/Pb=90/10 is formed with 6 μm in thickness. Subsequently, as shown in step 6, copper plating layer 50 is removed while silver plating layer 81 and solder plating layer 20 being masked. Then, at step 7, solder-substituted layer adhered to the silver plating surface is peeled off by the surface light etching, followed by drying at step 8. The copper plating layer 50 having a thickness of 1 μm or more formed as an undercoating layer of solder plating layer 20 can be applied in order to assure adhesion between silver plating layer 91 and the 42-alloy base. No particular problem arises if copper plating layer 50 is left without peeling off.

Figure 15:
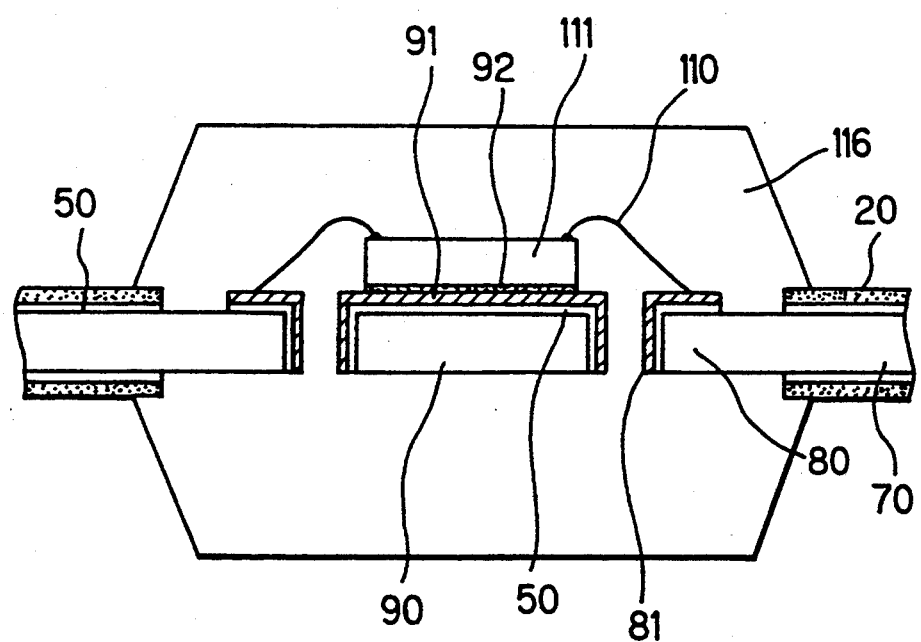
FIG. 15 is a sectional view showing an example of a structure of a resin-sealed semiconductor device using a PPF in accordance with the present invention.

FIG. 15 shows a sectional structure of a resin-sealed semiconductor device using a PPF thus produced. Here, in use of the PPF thus formed a semiconductor chip 111 is die-bonded on the PPF with an epoxy silver paste 92 which cures at a temperature from 160° to 170° C. In addition, Gold wires 110 are wire-bonded while super sonic waves being impressed at 160° to 170° C. Then, a mold is clamped on the PPF having semiconductor chip 111 built therein by clamping pressure of 2 ton/cm² at a mold temperature of 160° C. and is poured with a molding resin 116 at an injecting pressure of 100 kg/cm². The thus formed molding is extracted from the mold to be subjected to post-curing treatment at 160° C. Then, after marking step, the product is subjected to lead-cutting and lead bending, electric test and appearance observation check to thereby be shipped. As a result, it was confirmed that neither deformation of the solder plating nor degradation of solderability would occur after molding.

Next, still other specific examples with regards to the embodiment shown in FIG. 12 of the present invention, in which a metal layer of copper is provided between two solder layers, will be described.

Figure 14:
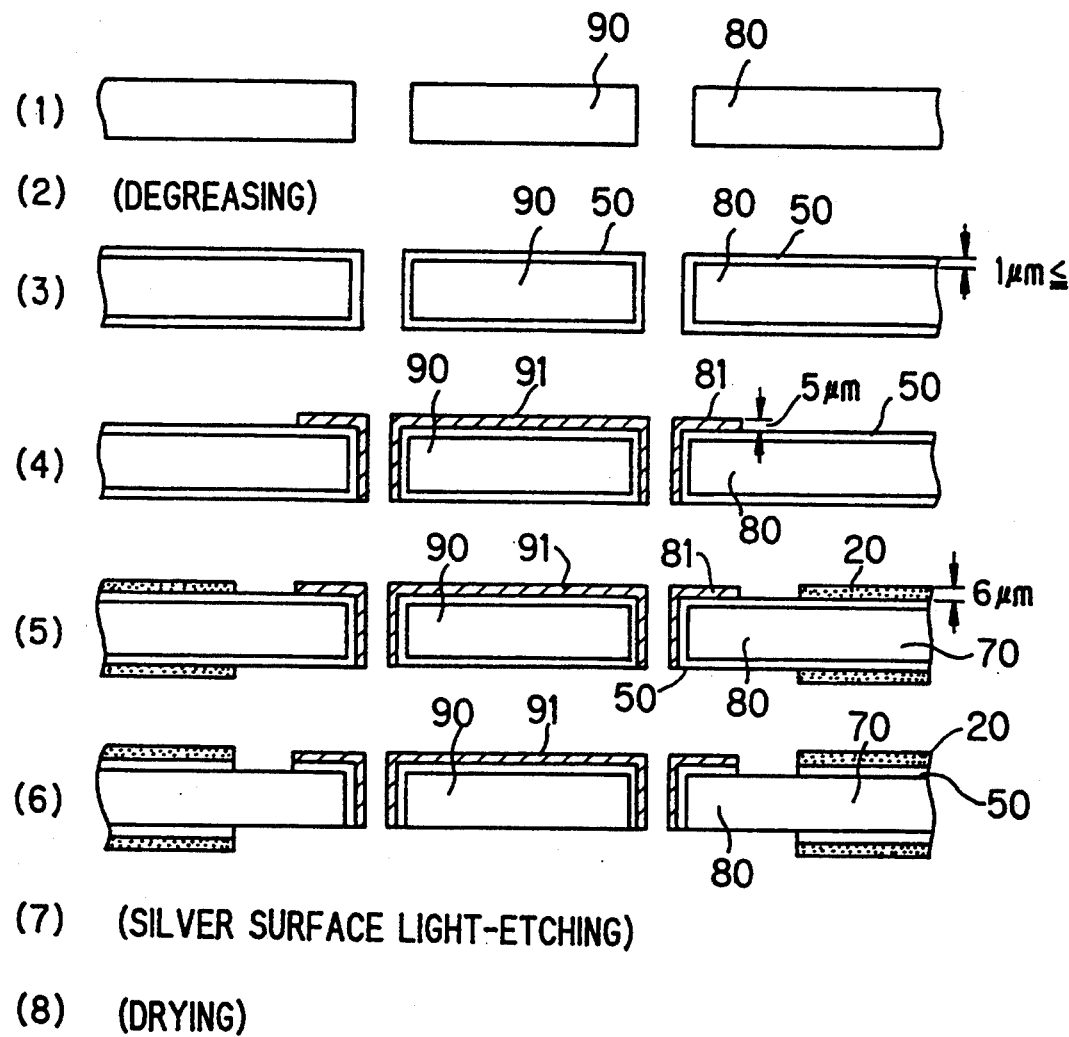
FIG. 14 is an illustrative view showing another example of processing steps for producing a PPF.

With regards to PPF production process, the same was conducted at steps 1 and 2 as shown in FIG. 14. Then omitting the copper plating at step 3 shown in FIG. 14, the operation proceeds to step 4 at which a silver plating was conducted while inner lead portion 80 and die pad portion 90 in the lead frame being masked so as to form silver plating layer 81 and 91 on inner lead portion 80 and die pad portion 90 without providing copper plating layer 50 at first. Thereafter, at step 5, with masking other than outer lead portion 70, a first solder plating layer 20 was formed. Subsequently, as shown in FIG. 12, copper plating layer 50 was formed on solder plating layer 20 as an intermediate layer. The operation was followed by provision of a second solder plating layer 20 on the intermediate layer.

Diffusion of copper into solder plating layer 20 is believed to be more increased as copper plating layer 50 is thicker. But in this case, PPF having solder plating layer 20 of 5 μm thick formed with copper plating layer 50 of 0.2 to 0.5 μm thick had a good effect to prevent solder plating layer deformation 100.

In use of the PPF thus formed a semiconductor chip 111 was die-bonded on the PPF with an epoxy silver paste 92 which cures at a temperature from 160° to 170° C. similarly as shown in FIG. 15. In addition, gold wires 110 are wire-bonded while super sonic waves being impressed at 160° to 170° C. Then, a mold was clamped on the PPF having semiconductor chip 111 built therein by clamping pressure of 2 ton/cm² at a mold temperature of 160° C. and was poured with a molding resin 116 at an injecting pressure of 100 kg/cm². The thus formed molding was extracted from the mold.

As a result, it was confirmed that neither deformation of the solder plating nor degradation of solderability would occur after molding. Here, in order to prevent deformation of a solder plating layer having a thickness of 5 μm or more, it is necessary to provide a thicker copper plating layer or two copper layers inside the solder plating layer.

In practice, provision of a copper plating layer of 1.5 μm thick in the solder plating layer of about 6 μm thick was found to be effective to prevent deformation of solder plating layer.

It was also confirmed that two copper layers provided inside a solder layer could be more effective to prevent deformation of the solder plating layer as compared to when a single copper layer was provided.

When a solder plating layer of about 6 μm thick with a single copper plating layer of 0.2 to 0.5 μm provided inside was heat-treated, improved effect for preventing deformation of solder plating layer was found.

As detailed heretofore, according to the present invention, since a tin plating layer having a high hardness is provided under the solder plating layer, the outer lead plating as a whole is improved in hardness. Accordingly, deformation of the solder plating layer at molding can be eliminated, therefore, no burr of solder plating will occur which would arise due to deformation of solder plating after the forming step, thus allowing provision of a highly reliable package using a PPF.

According to the present invention, since an element mixed in the solder plating bath for improving the hardness of the solder plating in warm-temperature range is contained in the formed solder plating layer, the hardness and melting point for the solder layer are heightened to thereby enhance deformation resistance. Accordingly, the deformation of solder plating occurring at mold-clamping is inhibited and no burr of solder plating will occur which would arise due to deformation of solder plating layer after the forming step, thus allowing provision of a highly reliable package using a PPF.

According to the present invention, since an element improving the hardness of the solder plating in warm-temperature range is contained in the solder plating layer by virtue of diffusion of a metal layer made of the element disposed under the solder plating layer, the hardness and melting point for the solder layer are heightened to thereby enhance deformation resistance. Accordingly, the deformation of solder plating occurring at mold-clamping is inhibited and adhesion between the lead frame base and the solder layer is improved, so that solder burr occurring at lead-cutting and lead-bending process can be prevented, thus allowing provision of a highly reliable package using a PPF.

According to the present invention, since an element improving the hardness of the solder layer in warm-temperature range is contained in the solder plating layer by virtue of diffusion of a metal layer made of the element inserted between the solder plating layers, the hardness and melting point for the solder layer are heightened to thereby enhance deformation resistance. Accordingly, the deformation of solder layer occurring at mold-clamping is inhibited and no burr of solder plating will occur which would arise due to deformation of solder plating after the forming step, thus allowing provision of a highly reliable package using a PPF.

In any of the above inventions, if solder plating is provided on the mold-clamping portion, deformation of solder plating can be prevented as described above, so that it is possible to apply the above inventions to any type of semiconductor devices.

What is claimed is:

1. A lead frame for use in a resin-sealed semiconductor device comprising: a lead frame with an inner lead portion or inner lead portion and die pad pattern being silver-plated and an outer lead portion being solder-plated; and a semiconductor chip being die-bonded on said die pad portion and wire-bonded to said inner lead portion, said lead frame further including a tin plating layer provided under the solder plating layer in said outer lead portion so as to prevent deformation of the solder plating.

2. A lead frame for use in a resin-sealed semiconductor device comprising: a lead frame with an inner lead portion or inner lead portion and die pad portion being silver-plated and an outer lead portion being solder-plated; and a semiconductor chip being die-bonded on said die pad portion and wire-bonded to said inner lead portion, said lead frame further including a solder plating layer formed on the surface of said outer lead portion by plating solder in a solder plating bath said solder plating containing any element of copper or nickel which enhances the hardness of solder plating in a warm-temperature range.

3. A lead frame for use in a resin-sealed semiconductor device comprising: a lead frame with an inner lead portion or inner lead portion and die pad portion being silver-plated and an outer lead portion being solder-plated; and a semiconductor chip being die-bonded on said die pad portion and wire-bonded to said inner lead portion, said lead frame further including a metal layer of copper or nickel on the frame which easily diffuses into the solder plating and which enhances the hardness of solder plating in a warm-temperature range, said metal layer being provided under the solder plating layer in said outer lead portion.

4. A lead frame for use in a semiconductor device according to claim 3 wherein said metal layer provided under the solder plating layer comprises a copper layer.

5. A lead frame for use in a semiconductor device according to claim 4 wherein said copper layer is 1 to 5 μm in film thickness.

6. A lead frame for use in a resin-sealed semiconductor device comprising: a lead frame with an inner lead portion or inner lead portion and die pad portion being silver-plated and an outer lead portion being solder-plated; and a semiconductor chip being die-bonded on said die pad portion and wire-bonded to said inner lead portion, said lead frame further including a copper plating layer provided under the silver plating layer provided in said inner lead portion and said die pad portion as well as under the solder plating layer provided in said outer lead portion.

7. A lead frame for use in a resin-sealed semiconductor device comprising: a lead frame with an inner lead portion or inner lead portion and die pad portion being silver-plated and an outer lead portion being solder-plated; and a semiconductor chip being die-bonded on said die pad portion and wire-bonded to said inner lead portion, said lead frame further including one or two metal layers of copper or nickel which easily diffuse into the solder plating and which enhance the hardness of the solder plating in a warm-temperature range provided inside the solder plating layer in said outer lead portion.

8. A resin-sealed semiconductor device comprising: a lead frame with an inner lead portion or inner lead portion and die pad portion being silver-plated and an outer lead portion being solder-plated; and a semiconductor chip being die-bonded on said die pad portion and wire-bonded to said inner lead portion, further including a tin plating layer provided under the solder plating layer in said outer lead portion so as to prevent deformation of the solder plating.

9. A resin-sealed semiconductor device comprising a lead frame with an inner lead portion or inner lead portion and die pad portion being silver-plated and an outer lead portion being solder-plated; and a semiconductor chip being die-bonded on said die pad portion and wire-bonded to said inner lead portion, further including a solder plating layer formed on the surface of said outer lead portion by plating solder in a solder plating bath, said solder plating containing any element of copper or nickel which enhances the hardness of the solder plating in a warm-temperature range.

10. A resin-sealed semiconductor device comprising: a lead frame with an inner lead portion or inner lead portion and die pad portion being silver-plated and an outer lead portion being solder-plated; and a semiconductor chip being die-bonded on said die pad portion and wire-bonded to said inner lead portion, said lead frame further including a metal layer of copper or nickel which easily diffuses into the solder plating and which enhances the hardness of the solder plating in a warm-temperature range, said metal layer being provided under the solder plating layer in said outer lead portion.

11. A semiconductor device according to claim 10 wherein said metal layer provided under the solder plating layer comprises a copper layer.

12. A semiconductor device according to claim 11 wherein said copper layer is 1 to 5 μm in film thickness.

13. A resin-sealed semiconductor device comprising: a lead frame with an inner lead portion or inner lead portion and die pad portion being silver-plated and an outer lead portion being solder-plated; and a semiconductor chip being die-bonded on said die pad portion and wire-bonded to said inner lead portion, said lead frame further including a copper plating layer provided under the silver plating layer provided in said inner lead portion and said die pad portion as well as under the solder plating layer provided in said outer lead portion so as to prevent deformation of the solder plating.

14. A resin-sealed semiconductor device comprising: a lead frame with an inner lead portion or inner lead portion and die pad portion being silver-plated and an outer lead portion being solder-plated; and a semiconductor chip being die-bonded on said die pad portion and wire-bonded to said inner lead portion, said lead frame further including one or two metal layers of copper or nickel which easily diffuse into the solder plating and which enhance the hardness of the solder plating in a warm-temperature range, said layers being provided inside the solder plating layer in said outer lead portion.

15. A lead frame as in claim 2 wherein the copper content of the solder plating layer is 1% or less.

16. A lead frame as in claim 3 wherein the copper content of the solder plating is from 0.1 to 0.3%.

* * * * *